United States Patent
Feng et al.

(10) Patent No.: US 7,865,802 B1
(45) Date of Patent: *Jan. 4, 2011

(54) DATA CODING FOR ENFORCING CONSTRAINTS ON ONES AND ZEROS IN A COMMUNICATIONS CHANNEL

(75) Inventors: Weishi Feng, San Jose, CA (US); Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/509,754

(22) Filed: Jul. 27, 2009

Related U.S. Application Data

(63) Continuation of application No. 11/799,362, filed on May 1, 2007, now Pat. No. 7,568,144, which is a continuation of application No. 10/423,552, filed on Apr. 25, 2003, now Pat. No. 7,269,778.

(60) Provisional application No. 60/418,552, filed on Oct. 15, 2002, provisional application No. 60/419,289, filed on Oct. 17, 2002, provisional application No. 60/419,732, filed on Oct. 18, 2002, provisional application No. 60/422,061, filed on Oct. 28, 2002.

(51) Int. Cl.
*H03M 13/00* (2006.01)
(52) U.S. Cl. .......................... 714/758; 714/752; 341/59
(58) Field of Classification Search ............... 714/752, 714/758; 341/59
See application file for complete search history.

(56) References Cited

U.S. PATENT DOCUMENTS

| | | | |
|---|---|---|---|
| 5,377,265 | A | 12/1994 | Wettengel et al. |
| 5,712,863 | A | 1/1998 | Gray |
| 5,815,514 | A | 9/1998 | Gray |
| 5,898,394 | A | 4/1999 | Kobayashi et al. |
| 5,931,968 | A | 8/1999 | Gray |
| 6,177,890 | B1 | 1/2001 | Keirn et al. |
| 6,260,171 | B1 | 7/2001 | Gray |
| 6,308,295 | B1 | 10/2001 | Sridharan et al. |
| 6,363,512 | B2 | 3/2002 | Gray |
| 6,438,724 | B1 | 8/2002 | Cox et al. |
| 6,513,139 | B2 | 1/2003 | Gray |
| 6,557,136 | B1 | 4/2003 | Friedmann |
| 6,631,490 | B2 | 10/2003 | Shimoda |
| 6,897,792 | B1 | 5/2005 | Feng |
| 7,006,016 | B1 | 2/2006 | Feng |
| 7,082,258 | B2 | 7/2006 | Kwak |
| 7,269,778 | B1 | 9/2007 | Feng et al. |

FOREIGN PATENT DOCUMENTS

EP 0926671 A1 6/1999

*Primary Examiner*—Sam Rizk

(57) ABSTRACT

A communications channel includes a buffer configured to store data. The data includes a plurality of symbols. A data dependent scrambler is configured to select a non-zero symbol and compare the non-zero symbol to each of the plurality of symbols stored in the buffer. In response to the non-zero symbol being different than each of the plurality of symbols stored in the buffer, the data dependent scrambler is further configured to generate a scrambling sequence to be used in scrambling the data, and the non-zero symbol is a seed of the scrambling sequence.

16 Claims, 15 Drawing Sheets

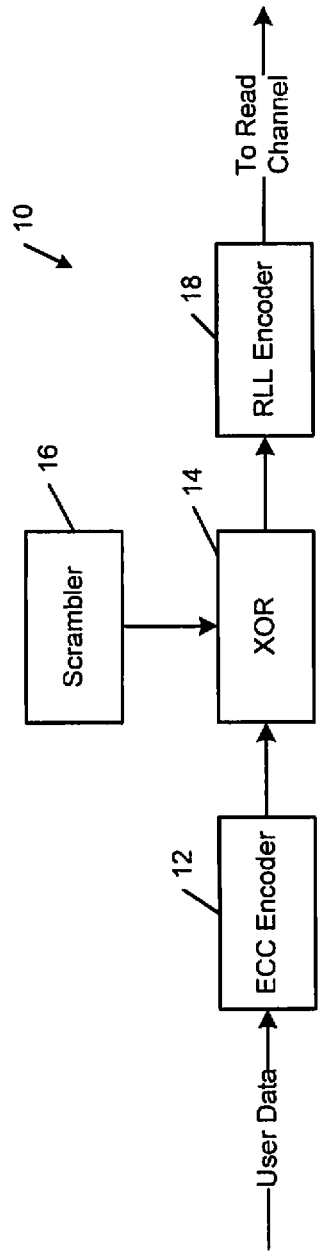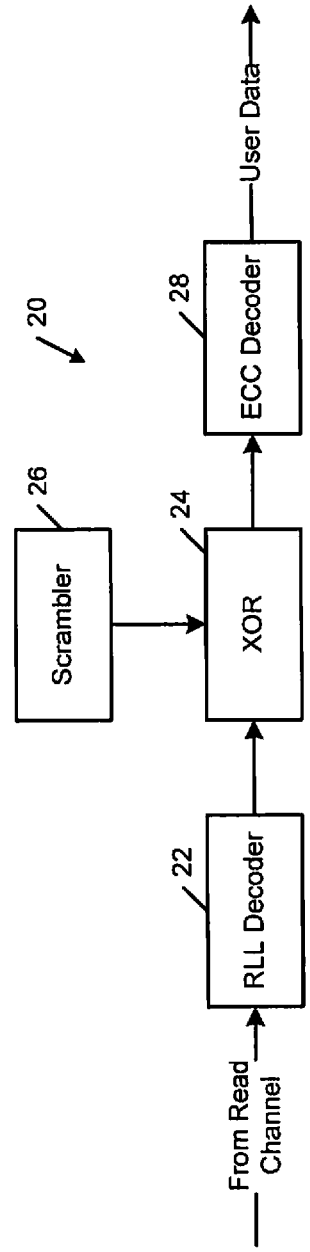

DATA CODING FOR ENFORCING CONSTRAINTS ON ONES AND ZEROS IN A COMMUNICATIONS CHANNEL

CROSS-REFERENCE TO RELATED APPLICATIONS

This application is a continuation of U.S. patent application Ser. No. 11/799,362, filed May 1, 2007, which is a continuation of U.S. patent application Ser. No. 10/423,552 (now U.S. Pat. No. 7,269,778), filed Apr. 25, 2003, which claims the benefit of U.S. Provisional Application Nos. 60/418,552, filed Oct. 15, 2002, 60/419,289, filed Oct. 17, 2002, 60/419,732 filed Oct. 18, 2002 and 60/422,061, filed Oct. 28, 2002, which are incorporated herein by reference in their entirety.

FIELD OF THE INVENTION

The present invention relates to data coding in a communications channel, and more particularly to data coding that reduces unwanted bits patterns in a communications channel.

BACKGROUND OF THE INVENTION

Magnetic storage systems such as disk drives include a magnetic medium or platter with a magnetic coating that is divided into data tracks. The data tracks are divided into data sectors that store fixed-sized data blocks. A read/write head typically includes a write circuit and write element such as an inductor that selectively generate positive and negative magnetic fields that are stored by the magnetic medium. The stored positive and negative fields represent binary ones and zeros. The read/write head includes an element such as a magneto-resistive element that senses the stored magnetic field to read data from the magnetic medium. A spindle motor rotates the platter and an actuator arm positions the read/write head relative to the magnetic medium.

Magnetic storage systems typically code the user data using Run Length Limited (RLL) code. RLL coding reduces sequences in the user data that may cause problems with timing circuits of the magnetic storage system. For example, a RLL code enforces constraints on the number of consecutive ones and/or zeros that are allowed to occur in the data. The efficiency of the RLL code is typically measured in terms of a code rate. For every m-bits or m-bytes of user data, an n-bit or n-byte encoded word is written to the storage media. RLL codes are used to eliminate bad patterns in the original data and typically do not have error correction capability.

Referring now to FIG. 1, a write path 10 in a conventional data storage system includes an error correction coding (ECC) encoder (ENC) 12 that receives user data. The ECC ENC 12 generates cyclic redundancy check (CRC) and/or ECC bits that are appended to the user data. The user data, CRC bits and/or ECC bits are output by the ECC ENC 12 to an input of an XOR gate 14. Another input of the XOR gate 14 receives an output of a data scrambler 16, which generates a pseudo-random binary sequence.

A scrambled output of the XOR gate 14 is input to a run length limited (RLL) ENC 18. The RLL ENC 18 encodes bit stings to prevent the unwanted bit patterns that violate the constraint and outputs a bit stream to a read channel (R/C). The RLL ENC 18 typically converts a block of $N_{RLL}$ bits into ($N_{RLL}$+1) bits to avoid the unwanted data patterns.

In FIG. 2, a read path 20 of a data storage system is shown. The read path 20 includes a RLL decoder (DEC) 22 that receives the bit stream from the read channel and decodes the bit stream. An output of the RLL DEC 22 is input to an XOR gate 24. A scrambler 26, which is the same as the scrambler 16, generates the pseudo-random binary sequence, which is input to another input of the XOR gate 24. An output of the XOR gate 24 is input to an ECC DEC 26, which performs ECC decoding and outputs the user data. The RLL ENC 18 eliminates unwanted data patterns. However, the RLL ENC 18 also reduces data storage capacity. In other words, RLL coding increases channel bit density (CBD), which reduces SNR and leads to lower reliability.

SUMMARY OF THE INVENTION

A communications channel that removes unwanted bit patterns from user data includes a buffer that receives the user data that includes a plurality of m-bit symbols. A data dependent scrambler communicates with the buffer, searches for a first m-bit symbol that is non-zero and that is different than the plurality of m-bit symbols in the user data and/or inverses of the plurality of m-bit symbols. The first m-bit symbol is a seed of the scrambling sequence. The data dependent scrambler generates a scrambling sequence by repeating the seed. A scrambling device communicates with the data dependent scrambler and scrambles the user data stored in the buffer using the selected scrambling sequence.

In still other features, the communications channel is a data storage system including a write path and a read path. A second coding device is located in the write path and removes runs of zeros in interleaved subsequences in the scrambled user data. The second coding device includes a first divider that separates the scrambled user data into at least one group including first and second symbols each with first and second interleaved subsequences. A symbol interleaver communicates with the first divider and interleaves the first and second symbols when the first interleaved subsequences of the first and second symbols are all zeros or the second interleaved subsequences of the first and second symbols are all zeros.

In still other features, a first decoder is located in the read path and includes a second divider that separates the scrambled user data into at least one group including first and second symbols. A symbol deinterleaver communicates with the second divider and deinterleaves the first and second symbols of the group when at least one of first and second symbols are all zeros.

In other features, a third coding device on the write path determines when one of the first and second symbols after interleaving is all zeros and the other of the first and second symbols is not all ones and replaces the all zero symbol with an all one symbol. A second decoding device on the read path determines when one of the first and second symbols is all ones and the other of the first and second symbols is not all zeros and replaces the all one symbol with all zeros and then performs bit deinterleaving.

In other features, the communications channel is a data storage system. An error correction coding (ECC) encoder generates ECC and CRC bits based on the scrambled user data and the seed and appends the ECC and CRC bits to the scrambled user data. A pattern eliminator communicates with the ECC encoder and eliminates unwanted bit patterns in the ECC and CRC bits.

In still other features, a first coding device receives the scrambled user data from the scrambling device. The first coding device includes a segmenter that segments the scrambled user data into Q segments. A counter communicates with the segmenter and counts a number of ones in each of the Q segments. An inverter communicates with the counter and inverts the segment if the number of ones in the segment is less than a predetermined number of ones and does not invert the segment if the number of ones is greater than or equal to the predetermined number of ones. An inverted segment indicator communicates with the inverter and appends inverted segment data to the segments.

In yet other features, the scrambling device performs bitwise XOR. The pattern eliminator includes a RLL encoder that encodes the ECC and the CRC bits.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1 is a functional block diagram of a write path in a data storage system according to the prior art;

FIG. 2 is a functional block diagram of a read path in a data storage system according to the prior art;

DETAILED DESCRIPTION OF THE PREFERRED EMBODIMENTS

Figure 3A:
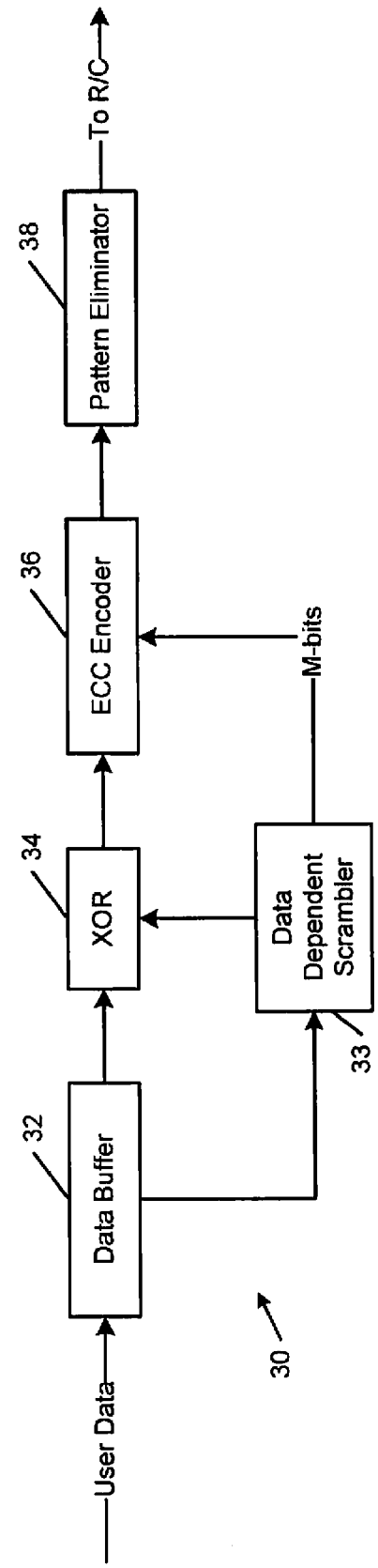
FIG. 3A illustrates a write path of a data storage system including a first data dependent scrambler according to the present invention.

The following description of the preferred embodiment(s) is merely exemplary in nature and is in no way intended to limit the invention, its application, or uses. For purposes of clarity, the same reference numbers will be used in the drawings to identify the same elements.

While the present invention will be described in the context of a data storage system, skilled artisans will appreciate that the present invention can be applied to any communications channel with constraints on the number of consecutive ones or zeros. As will be described further below, the data storage system according to the present invention does not employ RLL coding on a user data portion. The present invention discloses a coding technique that eliminates unwanted bit patterns with a smaller reduction in data storage capacity as compared to RLL coding. In other words, the coding technique according to the present invention reduces the channel bit density (CBD) less than data storage systems using RLL coding on the user data. As used herein, the term data dependent scrambler is defined as a scrambler that alters at least one of a selected scrambler, a generating polynomial, a seed, and a scrambling sequence based upon current user data that is to be scrambled.

Referring now to FIG. 3A, a write path 30 according to the present invention is shown for a data storage system. User data is input to a data buffer 32. A data dependent scrambling device 33 according to the invention searches for a suitable scrambling sequence based on the user data stored in the buffer and outputs the selected scrambling sequence to an input of XOR gate 34. The term data buffer as used herein is defined as any device that stores the data while the data dependent scrambling device identifies the scrambling sequence, scrambler, polynomial, and/or seed that will be used to scramble the user data. The scrambling sequence is data dependent in that it depends on the user data portion on the data buffer 32 as will be described below.

A delayed output of the data buffer 32 is also output to the XOR gate 34 when the scrambling sequence is found. The delay of the data buffer 32 should be sufficient to allow the scrambling sequence to be generated by the data dependent scrambler 33. An output of the XOR gate 34 and overhead bits that are output by the scrambler 33 are input to an ECC ENC 36, which appends the scrambler overhead bits to the scrambled user data. The ECC ENC 36 generates ECC and/or CRC bits based on the scrambled user data and/or the overhead bits. An output of the ECC encoder 36 is input to an optional pattern eliminator 38, which reduces remaining unwanted bit patterns (if any exist) and which will be described further below.

The data dependent scrambler 33 according to the present invention guarantees that the scrambled user data sequence will have a maximal length of a run of 0's that is less than $2*(m-1)$, where m is the symbol size. As used herein, the term symbol is defined as a group of bits. The scrambler 33 has symbol size m such that $(2^m-1) > k$, where k is the number of data symbols. Note that there are $(2^m-1)$ nonzero symbols. There are at least $(2^m-1-k)$ nonzero symbols, hereinafter a, that are different from any symbol in the user data.

Repeating the non-zero symbol a by k times gives a scrambling sequence (a, a, . . . , a). There are $(2^m-1-k)$ different scrambling sequences. Since a is different from any symbol in the user data, every symbol in the scrambled user data is nonzero, assuming that the scrambling involves bitwise XOR. The symbol a is the seed of the scrambling sequence. The maximal length of a run of 0's is $2*(m-1)$. For example, a worst case for two adjacent symbols for a 10-bit symbol would be symbol1=1000000000 followed by symbol2=0000000001. In this case, only m-bit overhead is needed.

Figure 3B:
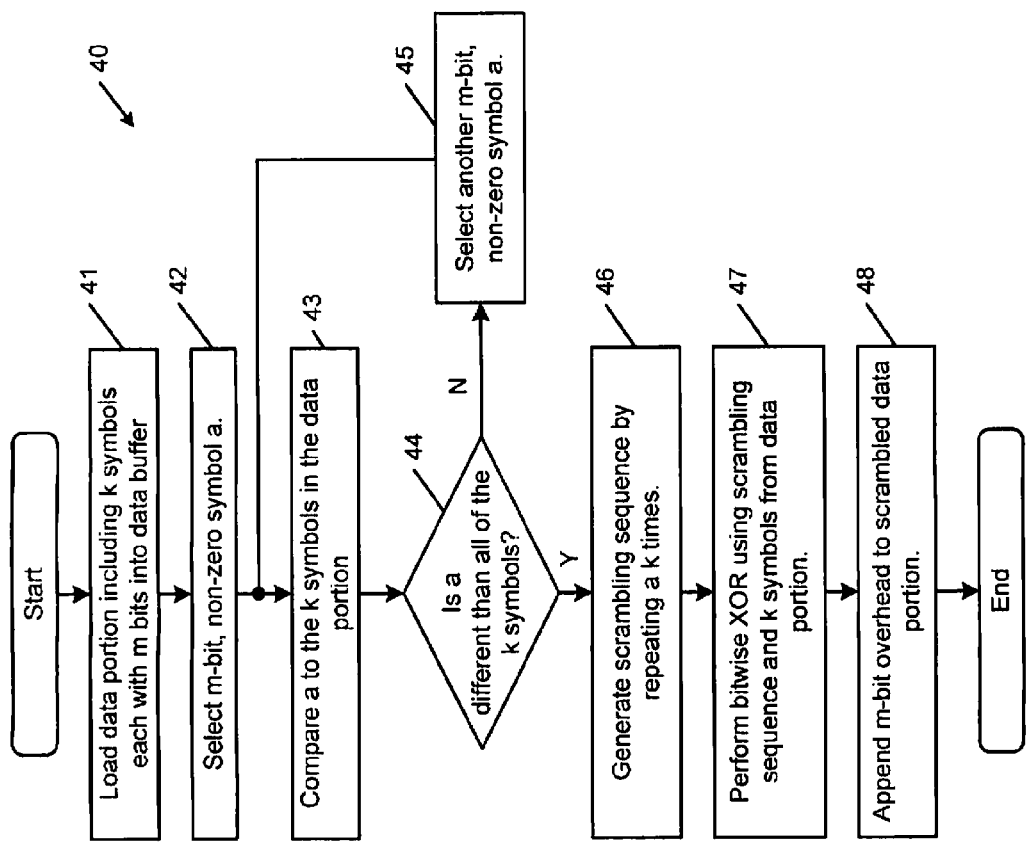
FIG. 3B is a flowchart illustrating steps that are performed by the first data dependent scrambler and write path in FIG. 3A.

Referring now to FIG. 3B, steps for operating the data dependent scrambler 33 are shown generally at 40. In particular, a data portion including k symbols each with m bits is loaded into the data buffer 32 in step 41. In steps 42-45, an exemplary method for finding non-zero symbols a that are not equal to any of the k symbols is shown.

In step 42, an m-bit, non-zero symbol a is selected. In step 43, a is compared to the k symbols that are stored in the data buffer. In step 44, if a is not different than all of the k symbols, another m-bit, non-zero symbol a is selected in step 45 and control continues with step 43. Otherwise, if a is different than all of the k symbols, control continues with step 46 and a scrambling sequence is generated by repeating symbol a k times. Once a is found, the bitwise XOR can begin. Alternately, a default worst case search time can be used. In step 47, bitwise XOR using the scrambling sequence and the k symbols is performed to generate a scrambled data portion. In step 48, the m-bit overhead is appended to the scrambled data portion either before or after ECC encoding is performed.

Note that the proposed method can also prevent long run of 1's. While searching for the scrambling sequence (a, a, . . . a), the search is modified to locate symbols a such that a is different from any symbol and its (bitwise) inversion in the user data. The symbol size m is selected such that $(2^m-1)>2*k$. The searching complexity is increased, which may increase the delay somewhat. After the data has been scrambled using the modified scrambling sequence, there will be no all-zero symbol or all-one symbol. Therefore, the maximal length of a run of zeros or ones is $(2*m-2)$.

In some applications, unwanted patterns also include a long run of zeros in any of the two interleaved sub-sequences. For example, in the bit sequence $b_0$ $b_1$ $b_2$ $b_3$ $b_4$ $b_5$ $b_6$ $b_7$ $b_8$ $b_9$ . . . , there should be no long runs of 0's in either of a first interleaved sub-sequence $b_0$ $b_2$ $b_4$ $b_6$ $b_8$ . . . and a second interleaved sub-sequence $b_1$ $b_3$ $b_5$ $b_7$ $b_9$. Without further processing, the length of a run of 0's in one of the subsequences could be very long despite the fact that every symbol is nonzero.

This problem can be solved by dividing the scrambled user data into one or more groups including two symbols. For example for m=10, a group includes a first symbol=($b_0$ $b_1$ $b_2$ $b_3$ $b_4$ $b_5$ $b_6$ $b_7$ $b_8$ $b_9$) and a second symbol=($b_{10}$ $b_{11}$ $b_{12}$ $b_{13}$ $b_{14}$ $b_{15}$ $b_{16}$ $b_{17}$ $b_{18}$ $b_{19}$). Each symbol includes two interleaved subsequences. If one of the two subsequences in both the first and second symbols is all zero, then bit-interleaving is performed as follows: ($b_0$ $b_{10}$ $b_2$ $b_{12}$ $b_4$ $b_{14}$ $b_6$ $b_{16}$ $b_8$ $b_{18}$) and ($b_1$ $b_{11}$ $b_3$ $b_{13}$ $b_5$ $b_{15}$ $b_7$ $b_{17}$ $b_9$ $b_{19}$). One of the bit-interleaved symbols will be all zero. All of the symbols in the groups without bit-interleaving are nonzero by default. Therefore, when a zero symbol is encountered in one of the groups on the decoding side before de-scrambling, deinterleaving is used to recover the scrambled user data sequences in the group.

Figure 4B:
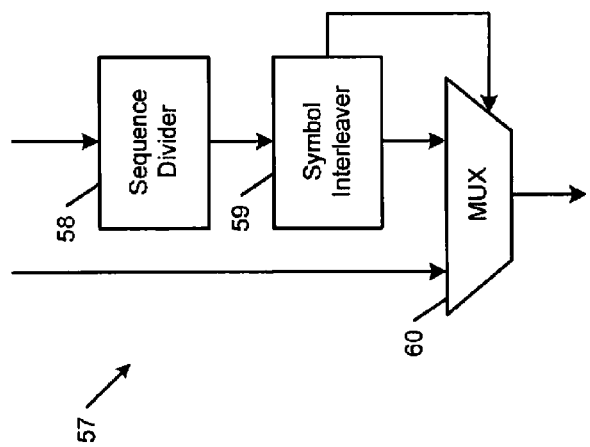
FIG. 4B is a functional block diagram of a coder that performs selective symbol interleaving in FIG. 4A.
Figure 4A:
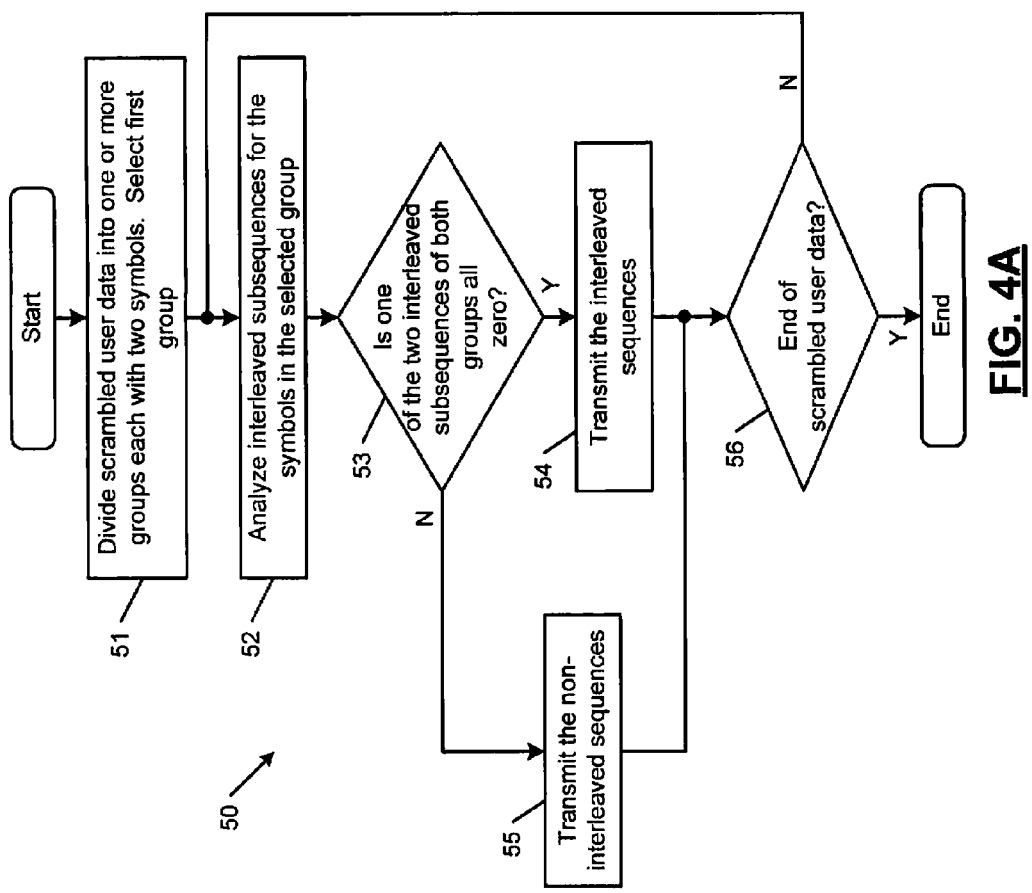
FIG. 4A illustrates coding steps on the write path for reducing unwanted bit patterns when interleaving is employed.

Referring now to FIG. 4A, steps for removing long runs of 0's from interleaved sequences is shown generally at 50. In step 51, the data is divided into one or more groups each with one or more symbols. In step 52, interleaved subsequences for the symbols are analyzed. In step 53, if one of the two interleaved subsequences for both groups is all zero, the interleaved sequences are transmitted in step 54. Otherwise, the non-interleaved sequences are transmitted in step 55. If there are additional groups in the user data as determined in step 56, control continues with step 52. Otherwise, control ends.

In FIG. 4B, an exemplary selective encoder or P-code ENC 57 for performing the steps of FIG. 4A are shown. For example, the selective encoder 57 is positioned after the XOR 34 or the ECC ENC 36 in FIG. 3A. A sequence divider divides the data into groups each having a first and second symbol. A symbol interleaver 59 checks for the conditions set forth in steps 52 and 53, interleaves the symbols and generates a select signal to a multiplexer 60 if the conditions are present. After the P-code ENC, the maximum number of consecutive zeros is $2*m$, where m is the symbol size. The sequence having $2*m$ consecutive zeros is (all-one, all-zero, all-zero, all-one). The maximum number of consecutive zeros in any interleaved subsequence is $2*(m-1)$.

Figure 5B:
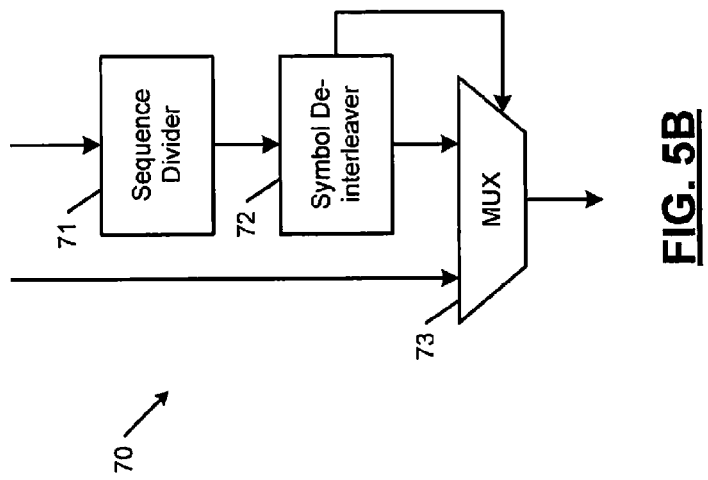
FIG. 5B is a functional block diagram of a decoder that performs the steps in FIG. 5A.
Figure 5A:
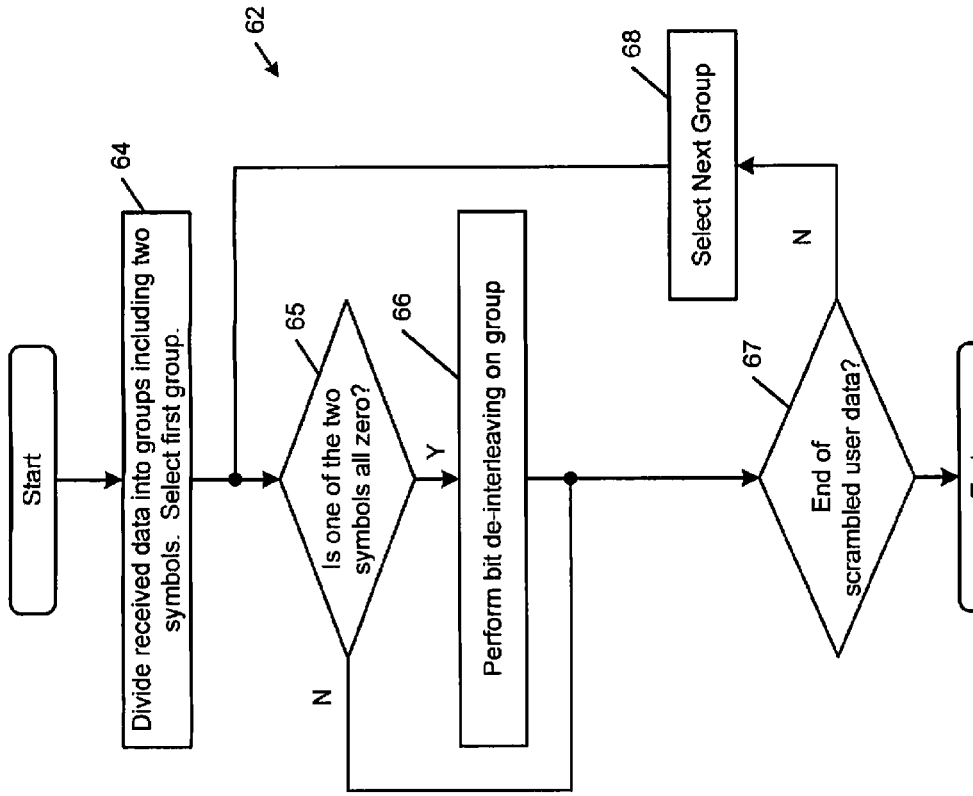
FIG. 5A illustrates decoding steps on the read path when the coding in FIG. 4A is used.

Referring now to FIG. 5A, decoding steps 62 are shown. The data is received and divided into groups in step 64. In step 65, control determines if one of the two symbols is all zero. If true, bit deinterleaving is performed on the symbols in step 66. If false, bit deinterleaving is not performed. If there is another group, as determined in step 67, the next group is selected in step 68 and control continues with step 65. Otherwise, control ends.

In FIG. 5B, an exemplary selective decoder or P-code DEC 70 for performing the steps of FIG. 5A are shown. A sequence divider 71 divides the data into groups each having a first and second symbol. A symbol deinterleaver 72 checks for the conditions set forth in steps 65, deinterleaves the symbols and generates a select signal to a multiplexer 73 if the conditions are present.

With the bit-interleaving technique described above, all-one symbols may also appear. However, an all-one symbol in a one group will either be preceded or followed by an all zero symbol. Therefore, the maximum length of a run of 1's is $2*m$. Therefore, the scramblers according to the present invention can prevent long runs of both zeros and ones in the data sequence and the interleaved subsequences. An all-one symbol can be produced only after bit interleaving. As such, an all-one symbol should either be preceded or followed by an all-zero symbol. Now the longest run of zeros happens in the following scenario (m=10): 1100000000 0000000000 0000000000 0000000011.

If the two symbols in a group after bit-interleaving are one all-zero symbol and one all-one symbol, then do nothing. If after bit-interleaving, the symbol other than the all-zero symbol is not an all-one symbol, then replace the all-zero symbol by an all-one symbol. On the decoding side, if a group contains an all-zero symbol and an all-one symbol, then do deinterleaving only. If a group contains an all-one symbol and a non-zero symbol, then replace the all-one symbol by all-zero symbol, then do deinterleaving. The length of the longest run of 0's is $2*m$.

If the number of consecutive 1's is a concern, then the following method can reduce the length of longest run of ones at the cost of increased length of longest run of zeros: If there are two consecutive all-zero symbols across the group boundary and neither of the other two symbols in the two groups is the all-one symbol and both bit $d_0$ and bit $d_1$ are zeros, then the two consecutive all-zero symbols are replaced by two all-one symbols. By doing so, the length of the longest run of zeros is $(3*m-2)$. The length of the longest run of ones is $(3*m-1)$.

Figure 6:
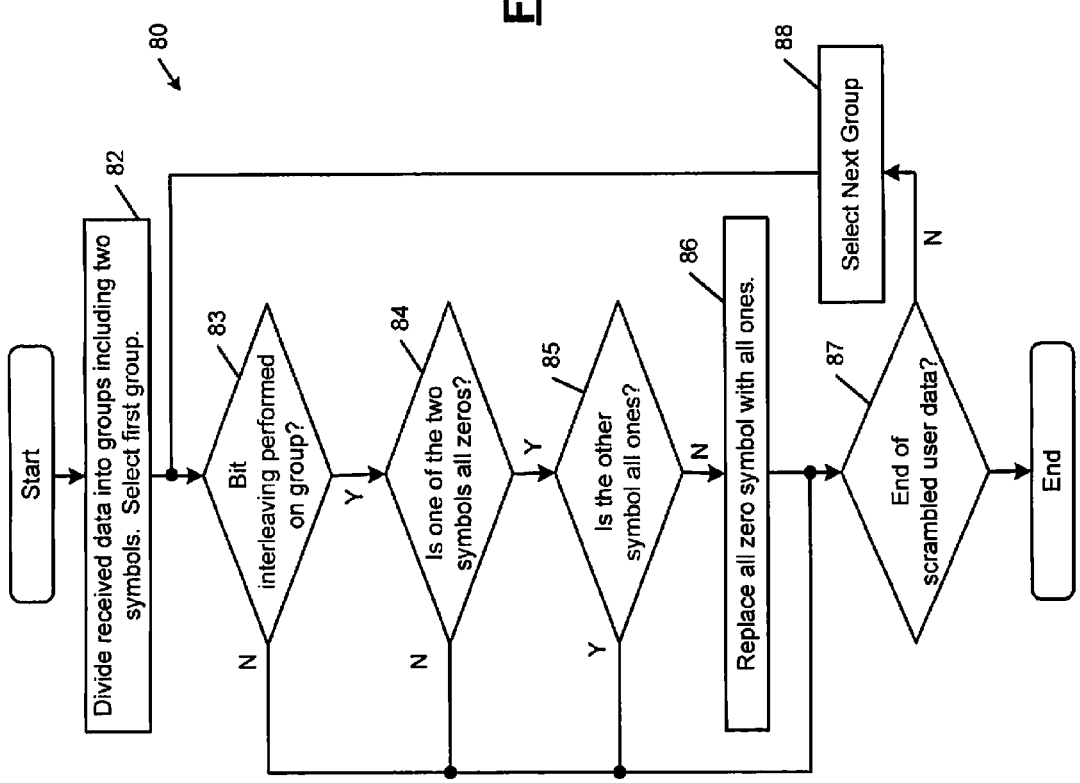
FIG. 6 illustrates coding steps on the write path for reducing all one symbols when bit interleaving is used.

Referring now to FIG. 6, steps that are performed on the write path to reduce all one symbols is shown generally at 80. The steps 80 shown in FIG. 19 are performed in addition to the steps in FIG. 4. In step 82, the received data is divided into groups, each having two symbols. If bit interleaving was performed on the group as determined in step 83, control continues with step 84. In step 84, control determines whether one of the two symbols is all zero. If true, control determines whether the other symbol is all ones in step 85. If true, control replaces the all zero symbol with all ones in step 86. Control continues from steps 84 if false, step 85 if true and step 86 with step where control determines whether there are additional groups. If true, control selects the next group in step 88 and continues with step 83. Otherwise control ends. The P-code ENC of FIG. 4B can be used to implement these steps.

Figure 7:
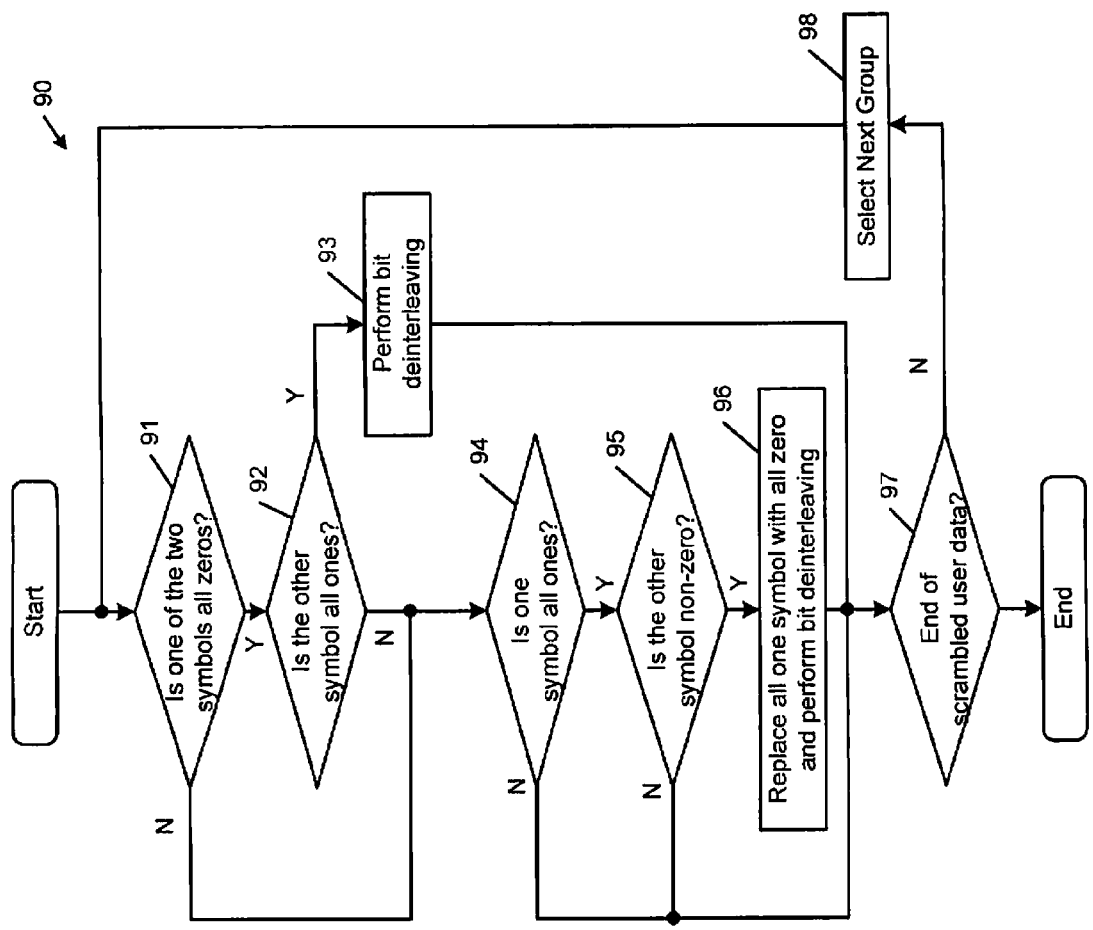
FIG. 7 illustrates decoding steps on the read path when the coding of FIG. 6 is used.

Referring now to FIG. 7, steps for decoding generally identified at 90 are shown. These steps are likewise performed in addition to the steps of FIG. 5. In step 91, control determines whether one of the two symbols is all zero. If true, control determines whether the other symbol is all ones in step 92. If true, bit deinterleaving is performed in step 93. If steps 91 and 92 are false, control determines whether one of the symbols is all ones. If true, control determines whether the other symbol is non-zero in step 95. If true, the all one symbol is replaced with all zeros and bit deinterleaving is performed in step 96. Control continues from steps 93 and 96 with step 97 where control determines whether there are additional groups in the user data. If true, the next group is selected in step 98 and control continues with step 91. The P-code DEC of FIG. 5B can be used to implement theses steps.

As can be appreciated, the data dependent scramblers, pattern eliminators, ECC coding/decoding and other structures that are described above can be implemented by application specific integrated circuits, dedicated circuits, software and a processor, discrete circuits and/or in any other suitable manner.

Figure 8:
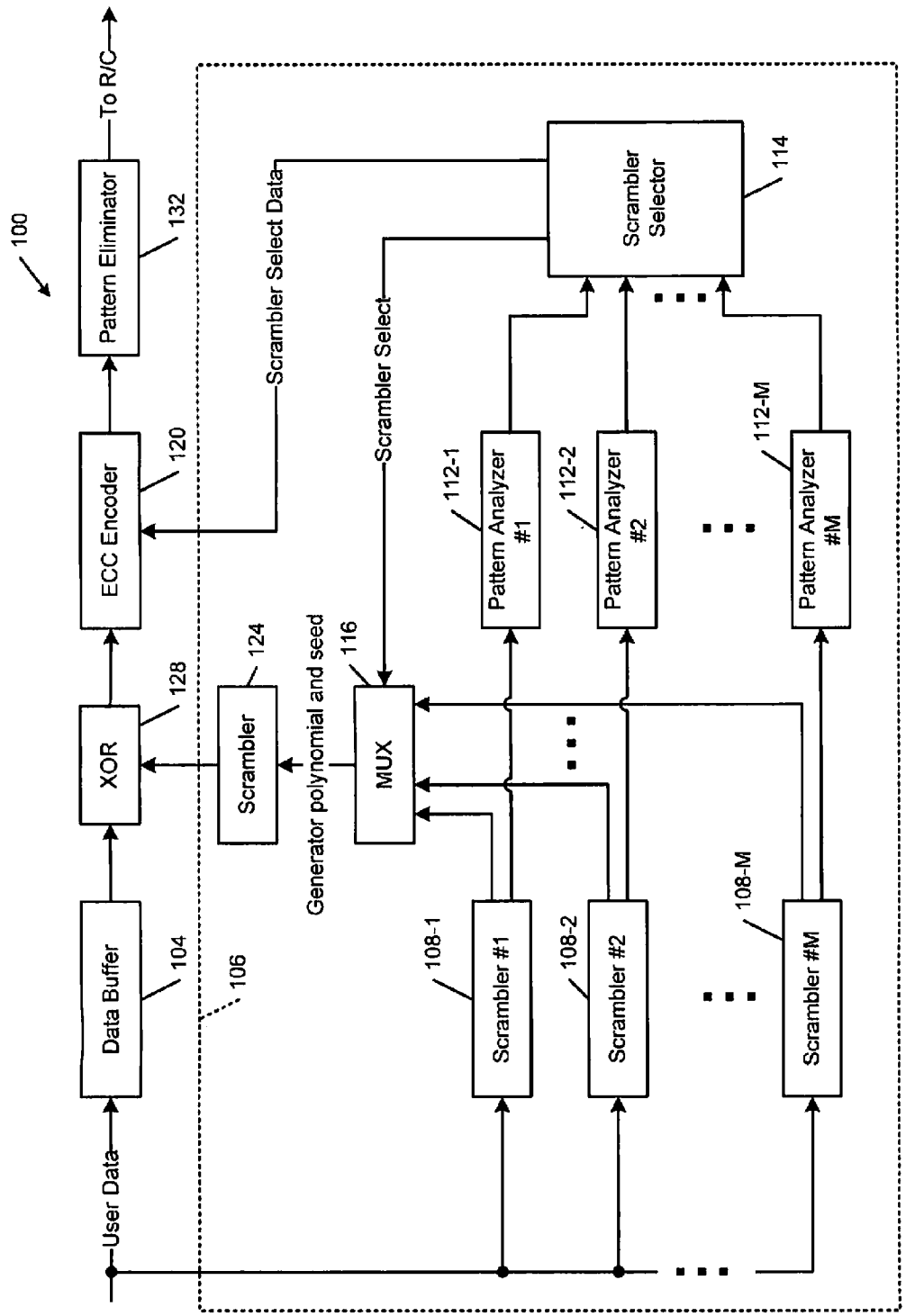
FIG. 8 illustrates a write path of a data storage system including a second data dependent scrambler according to the present invention.

Now we turn to several possible alternate configurations. Referring now to FIG. 8, a second data dependent scrambler according to the present invention for a write path 100 of a data storage system is shown. User data is input to a data buffer 104. A scrambling device 106 includes data dependent scramblers 108-1, 108-2, . . . , and 108-M that also receive the user data. Outputs of the scramblers 108-1, 108-2, . . . , and 108-M are input to corresponding pattern analyzers 112-1, 112-2, . . . , and 112-M and to a multiplexer 116. Outputs of the pattern analyzers 112-1, 112-2, . . . , and 112-M are input to a scrambler selector 120, which selects one of the scramblers, as will be described further below. Scrambler selection data is also output by the scrambler selector 120 to an ECC ENC 120, which appends the scrambler selection data to the scrambled user data. The scramblers 108 preferably perform conventional scrambling using a polynomial and a seed.

The multiplexer 116 outputs a generator polynomial and a scrambler seed to a scrambler 124. The scrambler 124 uses the generator polynomial and the seed to generate a scrambler sequence that is input to XOR gate 128, which also receives the user data from the data buffer 104. Scrambled user data is output by the XOR gate 128 to the ECC ENC 120. The ECC ENC 120 generates CRC and/or ECC bits that are appended to the scrambled user data and output to an optional pattern eliminator 132, as will be described below.

According to the present invention, data scrambling is moved before the ECC ENC 120. The data buffer 104 is located before the data scrambling. While the data is transferred into and stored in the data buffer 104, the M scramblers 108 are running in parallel. Outputs of the scramblers 108 are monitored by the M pattern analyzers 112. Each pattern analyzer 112 determines the relative suitability of the scrambled data relative to predetermined constraints. In a preferred embodiment, the pattern analyzer 112 assigns a weight to each unwanted bit pattern sequence, accumulates unwanted bit pattern weights, and outputs a sum of the unwanted bit pattern weights. After comparing the output of all the pattern analyzers 112, the selector 120 chooses the scrambler 108 that produces the best pattern statistics and/or the least unwanted bit pattern statistics.

The selector 120 directs the final scrambling block to use the selected scrambling polynomial and seed. Scrambler select data is also appended to the scrambled user data. For M-parallel scramblers 108, approximately $\log_2(M)$ bits of information is added. As can be appreciated, the overhead is much smaller than the RLL coding approach. Using the approach shown in FIG. 4 and assuming random data, the probability of seeing at least one run of at least 22 zeros in 4096 bits (512 bytes) is $(4096-21)/2^{22}=1$ $e^{-3}$.

Given M well designed scramblers 108, each scrambling sequence is considered independent. The probability that all of the M scrambled data sequences will contain at least one run of at least 22 zeros is $10^{-3M}$. This probability is $10^{-24}$ if M=8 and $10^{-48}$ if M=16. For the scrambled user data portion (excluding the CRC and the ECC), the scrambled user data from the selected scrambler will probably not contain any unwanted patterns.

Figure 9:
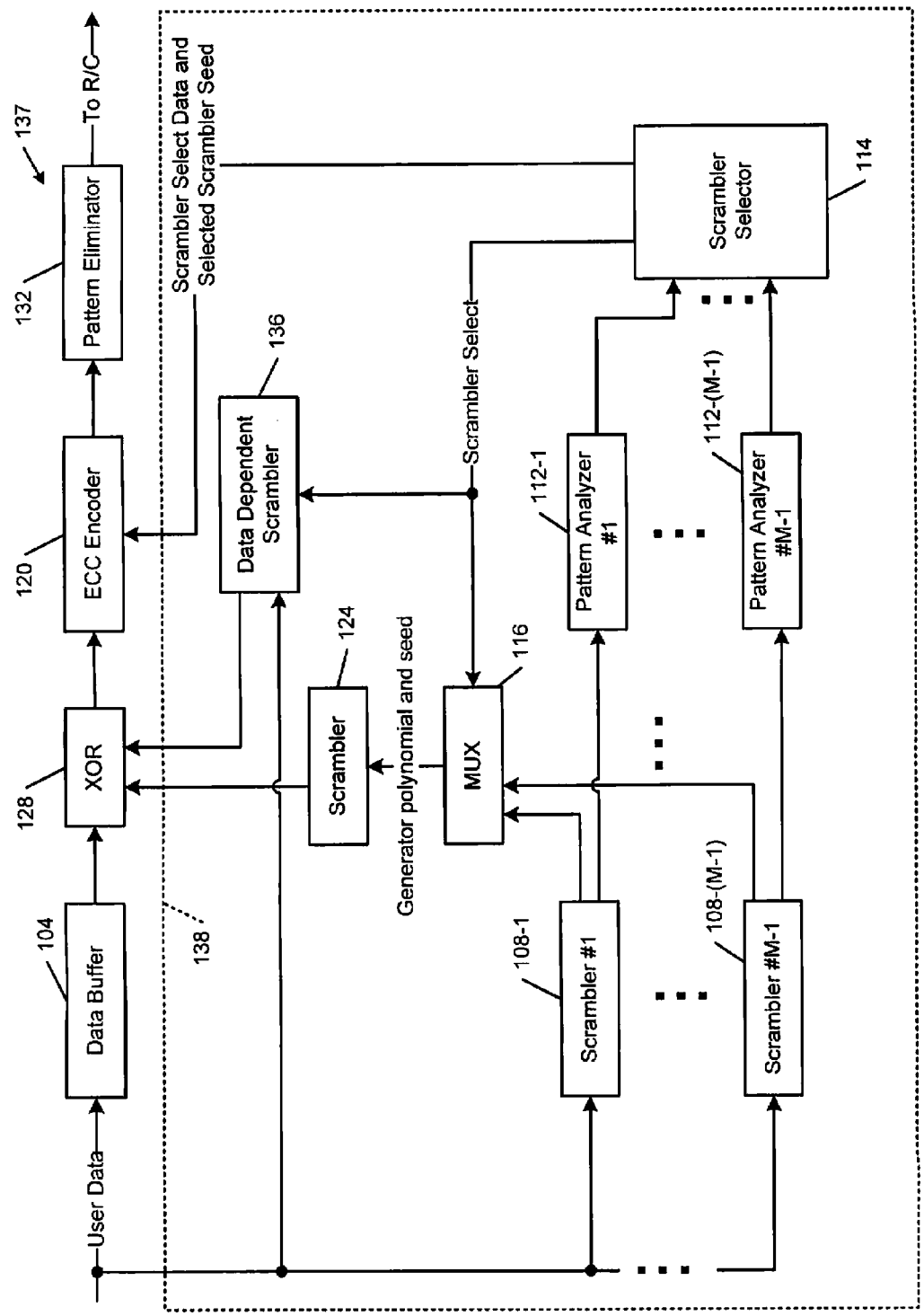
FIG. 9 illustrates a write path of a data storage system including a third data dependent scrambler according to the present invention.

Referring now to FIG. 9, a write path 137 includes a third data dependent scrambler device 138 including both conventional scramblers 108 and one or more scramblers 136 that are described in conjunction with FIGS. 3A and 3B. In one embodiment, M−1 scramblers 108 and the scrambler 136 are provided. In this case, the scrambler selector 114 selects one of the M−1 scramblers if the accumulated unwanted bit pattern weight is less than a predetermined performance threshold. If not, the scrambler selector 114 (or the MUX 116) selects the scrambler 136. The scrambler selector 114 outputs scrambler select data ($\log_2$ (M) bits) and the seed of the selected scrambler to the ECC ENC 120. The scrambler 136 is used to guarantee a worst-case performance.

Figure 10A:
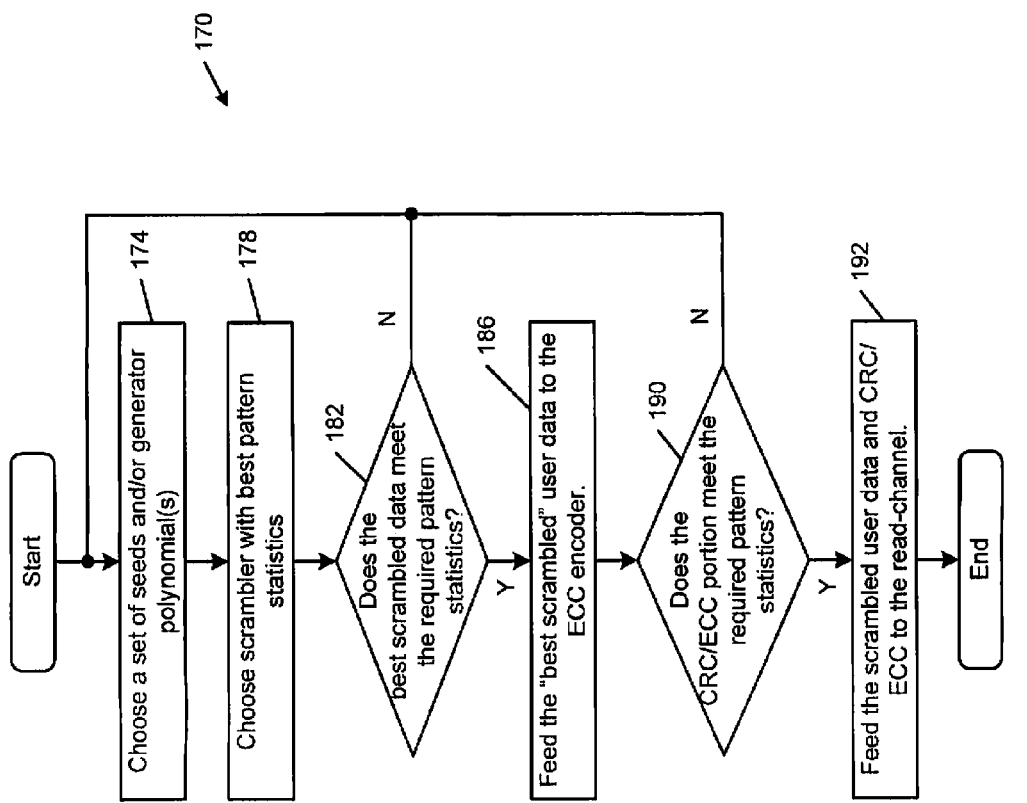
FIGS. 10A and 10B illustrate steps of first and second methods for performing retry when the resulting bit pattern is still unacceptable.

Referring now to FIG. 10A, steps for operating the scramblers using a retry process according to the present invention are shown generally at 170. In step 174, a set of seeds and/or generator polynomials are selected. In step 178, the scrambler with the best pattern statistics is selected. If the best scrambled pattern meets the required pattern statistics as determined in step 182, the best scrambled user data is fed to the ECC encoder in step 186. If step 182 is false, then the method continues with step 174. Continuing with step 186, if the CRC/ECC portion meets the required pattern statistics as determined in step 187, then the scrambled user data and CRC/ECC are output to the read channel in step 188. Otherwise, control loops to step 174.

There are several different options for coding the user data and CRC/ECC portions. According to one embodiment of the present invention, the user data section uses NRZ or INRZI code and the ECC section uses INRZI code. The user data section goes through the scrambler selection to minimize unwanted bit patterns. Therefore, there is less concern about long quasi-catastrophic sequences associated with NRZ coding. The ECC section cannot be scrambled. If no retry is performed when an unwanted ECC bit pattern is present, the ECC section is encoded using INRZI format. If retry is invoked upon the detection of an unwanted bit pattern in the ECC segment, then NRZ coding is still a good choice for the ECC section.

Figure 10B:
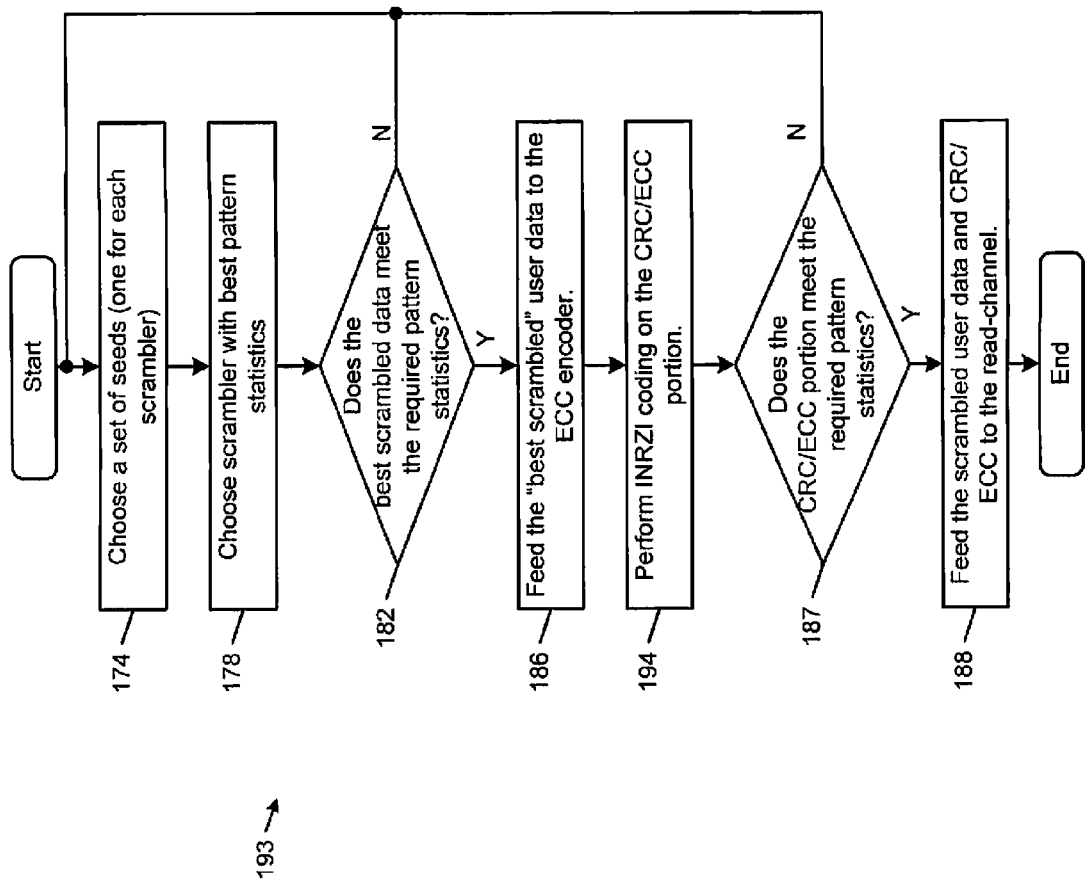

Referring now to FIG. 10B, many of the steps are the same as those shown in FIG. 10A. In FIG. 10B, steps for operating the scramblers using a retry process according to the present invention are shown generally at 193. However, after step 186, INRZI coding is performed on the CRC/ECC portion in step 194.

Figure 11:
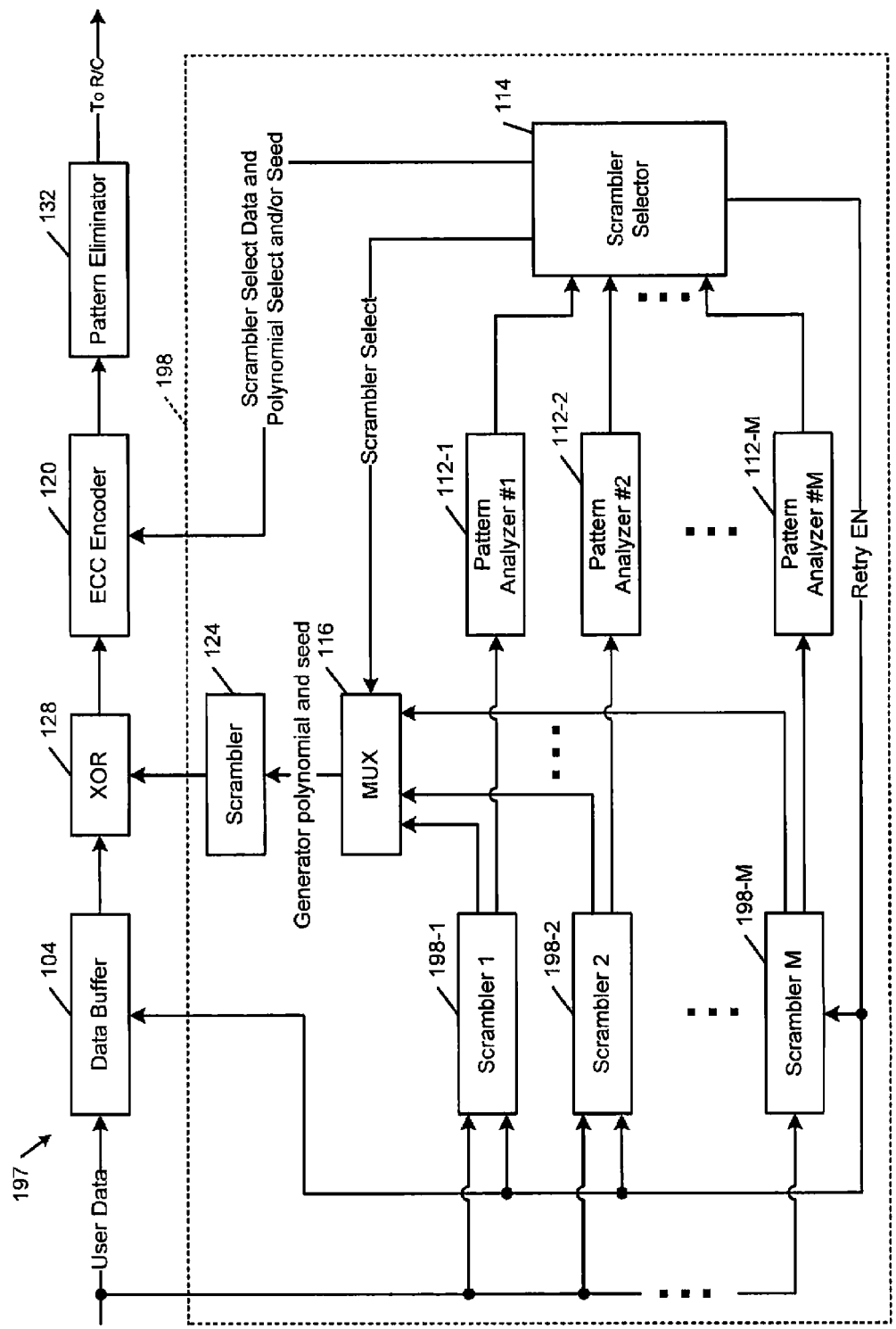
FIG. 11 illustrates a write path of a data storage system including a fourth data dependent scrambler with retry according to the present invention.

Referring now to FIG. 11, a write path 197 includes a data dependent scrambler device 198 with scramblers 198-1, 198-2, . . . , and 198-M that employ a retry process if bad patterns are not eliminated after coding. When retry is requested, the scramblers 198 change the polynomial generator and/or the seed. If the polynomial generator and/or the seed vary, selector information includes a polynomial selector and/or a seed selector.

Figures 12A, 12B:
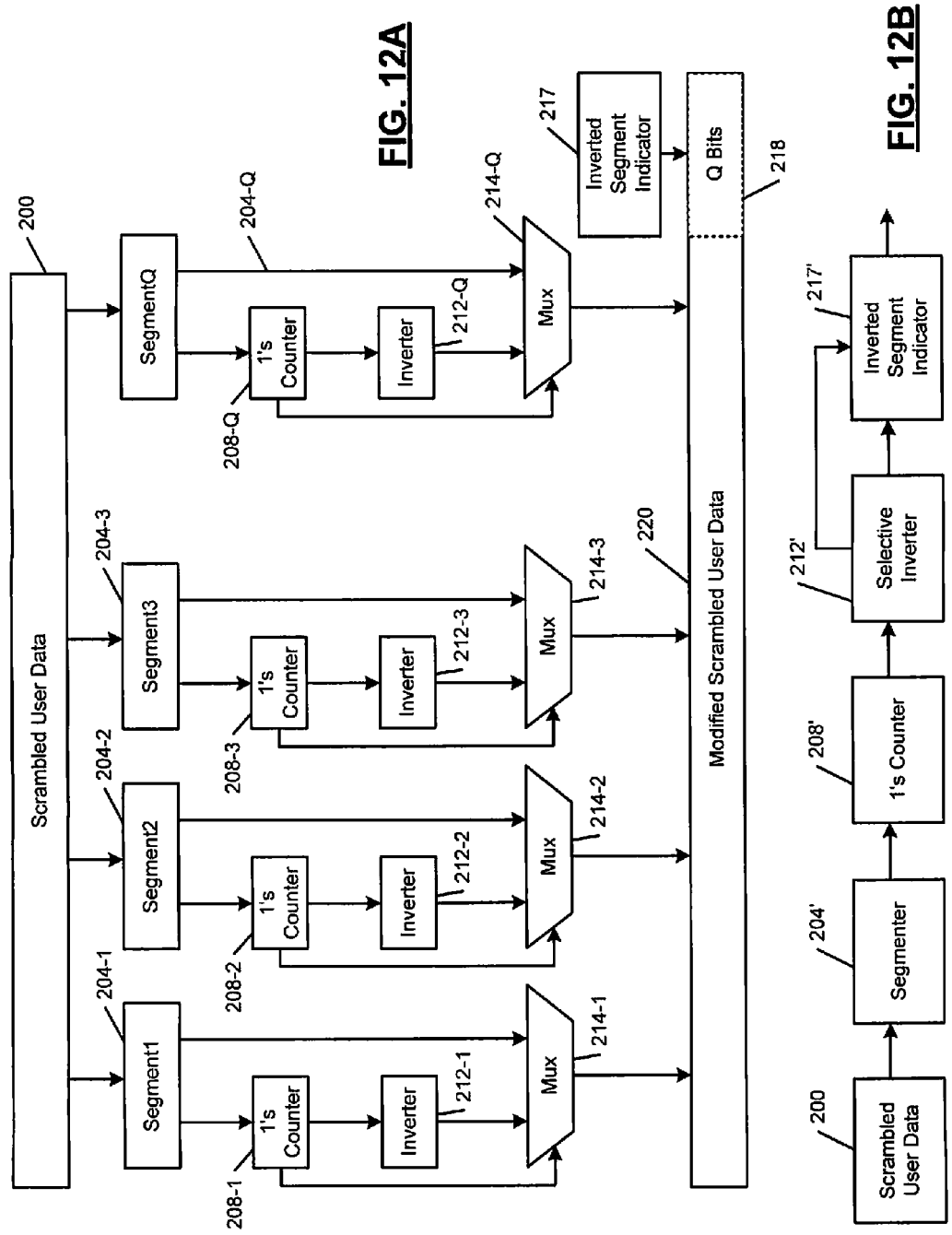
FIGS. 12A and 12B illustrate parallel and serial devices for reducing unwanted bit patterns when interleaved nonreturn to zero inverted (INRZI) coding is employed.

Referring now to FIG. 12A, there may still be intermediate runs of bad patterns after selecting the best scrambler. Another coding step can be introduced to reduce the bad pattern statistics when interleaved non return to zero inverted (INRZI) coding is used. Scrambled user data 200 is divided into Q data segments 204-1, 204-2, . . . 204-Q of equal and/or nominally equal sizes. If the total number of 1's in each segment 204 is less than half of the segment size as determined by 1's counters 208-1, 208-2, . . . , 208-Q, all of bits in the segment are inverted by inverters 212-1, 212-2, . . . , 212-Q. When inversion should occur, the counters 208 generate a MUX select control signal to switch multiplexers 216-1, 216-2, . . . , 216-Q between the inverted and non-inverted segments. An inverted segment indicator 217 appends inverted and non-inverted bits of overhead data 218 to modified scrambled user data 220. The Q-bits are used to indicate the inverted segments. While a parallel implementation is shown in FIG. 12A, a serial implementation that is shown in FIG. 12B can also be used.

Figure 13:
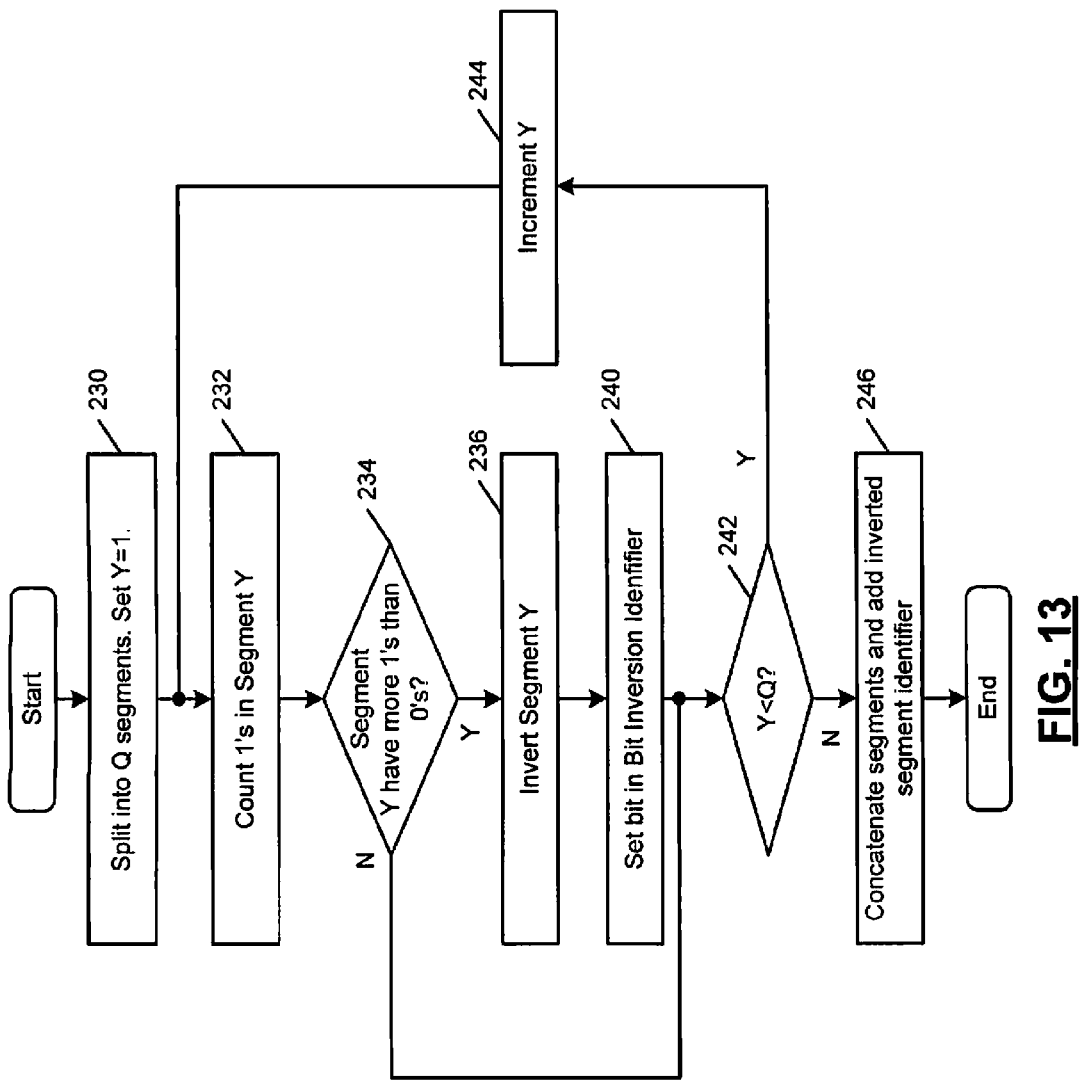
FIG. 13 illustrates steps that are performed by the devices in FIGS. 12A and 12B.

Referring now to FIG. 13, steps for generating the modified scrambled user data are shown. In step 230, the scrambled user data is split into Q segments and a counter Y is set equal to 1. In step 232, the 1's in segment identified by Y are counted. If there are more 1's than 0's as determined in step 234, the segment is inverted in step 236 and a bit is set in a bit inversion identifier in step 240. If Y<Q as determined in step 242, Y is incremented in step 244. Otherwise, the inverted segments identifier is appended to the modified scrambled use data 220 in step 246.

Figure 14:
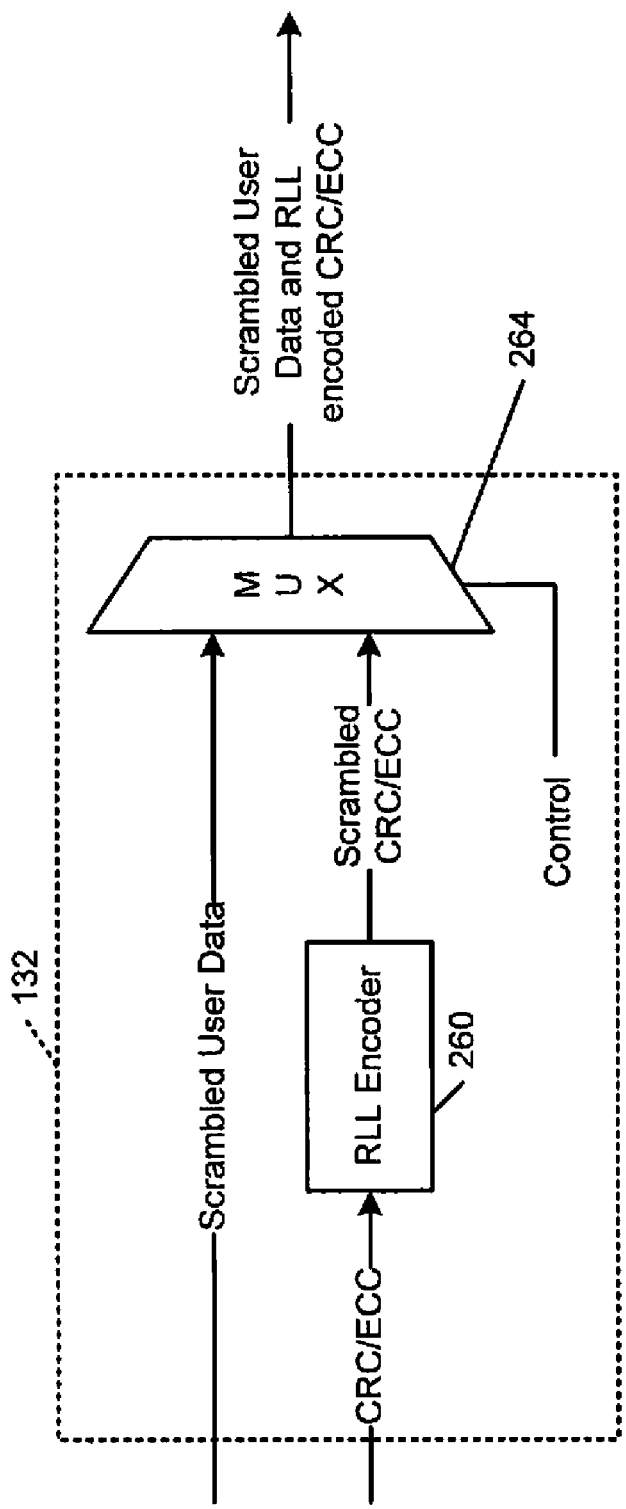
FIG. 14 is a functional block diagram of an exemplary pattern eliminator.

The CRC and ECC symbols that are appended by the ECC ENC to the user data may still have unwanted bit patterns after coding using the embodiments described above. The pattern eliminator 132 is inserted after the ECC ENC to solve this problem. In one embodiment shown in FIG. 14, the pattern eliminator 132 includes a RLL ENC 260. A multiplexer 264 joins the scrambled user data and the RLL-encoded CRC/ECC bits. RLL coding is not performed on the user data portion. In this case, the RLL coding on the CRC/ECC portion of data will consume some capacity. However, the consumption of the data storage capacity is much smaller since the length of the CRC/ECC portion is relatively small as compared to the length of the user data. Therefore, the use of the RLL coding has a minimal impact.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A communications channel, comprising:
   a buffer configured to store data, the data comprising a plurality of symbols; and
   a data dependent scrambler configured to
      select a non-zero symbol; and
      compare the non-zero symbol to each of the plurality of symbols stored in the buffer;
   wherein in response to the non-zero symbol being different than each of the plurality of symbols stored in the buffer, the data dependent scrambler is further configured to generate a scrambling sequence to be used in scrambling the data, and the non-zero symbol is a seed of the scrambling sequence.

2. The communications channel of claim 1, wherein the communications channel is implemented in a data storage system.

3. The communications channel of claim 1, wherein the non-zero symbol is further different than a corresponding inverse of each of the plurality of symbols stored in the buffer.

4. The communications channel of claim 1, further comprising:
   a scrambling device to scramble the data stored in the buffer using the scrambling sequence.

5. The communications channel of claim 4, further comprising an error correction coding (ECC) encoder configured to:
   generate error correction coding (ECC) bits and cyclic redundancy check (CRC) bits based on both the scrambled data and the seed; and
   append the error correction coding (ECC) bits and the cyclic redundancy check (CRC) bits to the scrambled data.

6. The communications channel of claim 5, further comprising a pattern eliminator configured to eliminate unwanted bit patterns in at least one of the scrambled data, the error correction coding (ECC) bits, and the cyclic redundancy check (CRC) bits.

7. The communications channel of claim 6, wherein the pattern eliminator comprises a run length limited (RLL) encoder configured to encode the error correction coding (ECC) bits and the cyclic redundancy check (CRC) bits.

8. The communications channel of claim 4, wherein the scrambling device performs a bitwise XOR of the data and the scrambling sequence to generate the scrambled data.

9. A method comprising:
   storing data in a buffer, the data having been received from a communications channel, the data including a plurality of symbols;
   selecting a non-zero symbol; and
   comparing the non-zero symbol to each of the plurality of symbols stored in the buffer;
   wherein in response to the non-zero symbol being different than each of the plurality of symbols stored in the buffer, generating a scrambling sequence to be used in scrambling the data, the non-zero symbol being a seed of the scrambling sequence.

10. The method of claim 9, wherein the communications channel is implemented in a data storage system.

11. The method of claim 9, wherein the non-zero symbol is further different than a corresponding inverse of each of the plurality of symbols stored in the buffer.

12. The method of claim 9, further comprising:
    scrambling the data stored in the buffer using the scrambling sequence.

13. The method of claim 12, further comprising:
    generating error correction coding (ECC) bits and cyclic redundancy check (CRC) bits based on both the scrambled data and the seed; and
    appending the error correction coding (ECC) bits and the cyclic redundancy check (CRC) bits to the scrambled data.

14. The method of claim 13, further comprising:
    eliminating unwanted bit patterns in at least one of the scrambled data, the error correction coding (ECC) bits, and the cyclic redundancy check (CRC) bits.

15. The method of claim 14, further comprising encoding each of the error correction coding (ECC) bits and the cyclic redundancy check (CRC) bits.

16. The method of claim 9, wherein scrambling the data comprises performing a bitwise XOR of the data and the scrambling sequence.

* * * * *